(12) United States Patent
Li et al.

(10) Patent No.: US 10,504,983 B2
(45) Date of Patent: Dec. 10, 2019

(54) THIN FILM TRANSISTOR AND MANUFACTURING METHOD THEREOF, ARRAY SUBSTRATE AND DISPLAY DEVICE

(71) Applicant: BOE TECHNOLOGY GROUP CO., LTD., Beijing (CN)

(72) Inventors: Yanzhao Li, Beijing (CN); Hu Meng, Beijing (CN); Defeng Mao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/705,538

(22) Filed: Sep. 15, 2017

(65) Prior Publication Data

US 2018/0204898 A1    Jul. 19, 2018

(30) Foreign Application Priority Data

Jan. 16, 2017    (CN) .......................... 2017 1 0030672

(51) Int. Cl.
*H01L 29/06*    (2006.01)
*H01L 27/32*    (2006.01)
(Continued)

(52) U.S. Cl.
CPC .......... *H01L 27/3262* (2013.01); *B82Y 10/00* (2013.01); *H01L 27/3248* (2013.01); *H01L 27/3274* (2013.01); *H01L 29/0673* (2013.01); *H01L 29/66439* (2013.01); *H01L 29/66742* (2013.01); *H01L 29/7869* (2013.01); *H01L 29/78651* (2013.01); *H01L 29/78666* (2013.01);
(Continued)

(58) Field of Classification Search
CPC .......... H01L 27/3262; H01L 29/78696; H01L 51/0558; H01L 29/775; H01L 27/3248; H01L 29/0673; H01L 27/3274; H01L 29/66439; H01L 29/66742; H01L 29/78651; H01L 27/1222; H01L 2227/323; H01L 51/0048
See application file for complete search history.

(56) References Cited

U.S. PATENT DOCUMENTS 6,239,468 B1 * 5/2001 Chang ............... H01L 29/41733
257/347
2001/0015440 A1 * 8/2001 Tsubata ............. H01L 29/41733
257/59
(Continued)

FOREIGN PATENT DOCUMENTS

CN    104022157 A    9/2014
CN    105789317 A    7/2016

OTHER PUBLICATIONS

First Office Action for Chinese Patent Application No. 201710030672.0 dated May 5, 2019.

*Primary Examiner* — Kyoung Lee
(74) *Attorney, Agent, or Firm* — Calfee, Halter & Griswold LLP (57) ABSTRACT

A thin film transistor, a method for manufacturing the same, an array substrate, and a display device are provided. The thin film transistor includes a substrate; a gate electrode, a gate insulating layer, an active layer, a source electrode, and a drain electrode provided on the substrate; wherein the active layer includes a source region, a drain region, and a channel region between the source region and the drain region, the channel region having a bending pattern.

11 Claims, 3 Drawing Sheets

(51) Int. Cl.
*H01L 29/786* (2006.01)
*H01L 51/05* (2006.01)
*H01L 29/66* (2006.01)
*B82Y 10/00* (2011.01)
H01L 27/12 (2006.01)
H01L 29/775 (2006.01)
H01L 51/00 (2006.01)

(52) U.S. Cl.
CPC .. *H01L 29/78669* (2013.01); *H01L 29/78696* (2013.01); *H01L 51/0558* (2013.01); H01L 27/1222 (2013.01); H01L 29/775 (2013.01); H01L 51/0048 (2013.01); H01L 2227/323 (2013.01)

(56) References Cited

U.S. PATENT DOCUMENTS

2007/0128777 A1 6/2007 Yin et al.
2007/0195252 A1* 8/2007 Tsai ..................... G02F 1/1339
349/143

* cited by examiner

THIN FILM TRANSISTOR AND MANUFACTURING METHOD THEREOF, ARRAY SUBSTRATE AND DISPLAY DEVICE

CROSS-REFERENCE TO RELATED APPLICATIONS

The present application claims priority to Chinese Patent Application No. 201710030672.0, filed Jan. 16, 2017, and entitled "thin film transistor and manufacturing method thereof, array substrate and display device", the entire contents of which are incorporated herein by reference.

TECHNICAL FIELD

The embodiments of present disclosure relate to a thin film transistor and manufacturing method thereof, an array substrate and a display device.

BACKGROUND

In recent years, the development of display technology has exploded, and the early Cathode Ray Tube (CRT) display has also been replaced by active matrix type displays such as an Active Matrix Liquid Crystal Display (AMLCD), an Active Matrix Organic Light Emitting Diode (AMOLED) display. Among these active matrix type displays, thin film transistors (TFTs) have received great attention and are widely used as core devices for active matrix display technology.

In the manufacturing process of a thin film transistor, the manufacturing process of an active layer is one core process of TFT technology. The materials of the active layer include amorphous silicon, metal oxide semiconductors, etc. Since very few materials can be selected for the active layer, it is necessary to improve the performance of the active layer from the manufacturing process of the active layer and the pattern design of the active layer.

SUMMARY

At least one embodiment of the present disclosure provides a thin film transistor including a substrate; a gate electrode, a gate insulating layer, an active layer, a source electrode, and a drain electrode provided on the substrate; wherein the active layer includes a source region, a drain region, and a channel region between the source region and the drain region, the channel region having a bending pattern.

In the thin film transistor provided by at least one embodiment of the present disclosure, the bending pattern is selected from a group consisting of a curved line bending pattern, a straight line bending pattern, and a combination of the curved line bending pattern and the straight line bending pattern.

In the thin film transistor provided by at least one embodiment of the present disclosure, the curved line bending pattern is selected from a group consisting of a semicircular ring pattern, a non-closed circular pattern, an S-shaped pattern, and a spiral curved shaped pattern.

In the thin film transistor provided by at least one embodiment of the present disclosure, the straight line bending pattern is selected from a group consisting of a semi-square pattern, a non-closed rectangular pattern, a zigzag pattern, and a helical "rectangular-ambulatory-plane" pattern.

In the thin film transistor provided by at least one embodiment of the present disclosure, an aspect ratio of the active layer is from 0.01 to 0.1.

In the thin film transistor provided by at least one embodiment of the present disclosure, materials of the active layer include one-dimensional semiconductive nanomaterials.

In the thin film transistor provided by at least one embodiment of the present disclosure, the one-dimensional semiconductive nanomaterials include semiconductive carbon nanotubes or semiconductive silicon nanowires.

In the thin film transistor provided by at least one embodiment of the present disclosure, the thin film transistor has a top gate type structure or a bottom gate type structure.

At least one embodiment of the present disclosure provides an array substrate including any one of the above described thin film transistors and a first electrode electrically connected to the source electrode or the drain electrode of the thin film transistor.

In the array substrate provided by at least one embodiment of the present disclosure, the first electrode is a pixel electrode, and the array substrate further includes a common electrode, and the common electrode and the pixel electrode form an electric field.

In the array substrate provided by at least one embodiment of the present disclosure, the first electrode is an anode, and the array substrate further includes an organic material functional layer and a cathode located above the anode.

At least one embodiment of the present disclosure provides a display device including any one of the above described array substrates.

At least one embodiment of the present disclosure provides a method for manufacturing a thin film transistor including providing a substrate, forming a gate electrode, a gate insulating layer, an active layer, a source electrode, and a drain electrode on the substrate; wherein the active layer includes a source region, a drain region, and a channel region between the source region and the drain region, the channel region having a bending pattern.

In the method for manufacturing a thin film transistor provided by at least one embodiment of the present disclosure, the bending pattern is selected from a group consisting of a curved line bending pattern, a straight line bending pattern, and a combination of the curved line bending pattern and the straight line bending pattern.

In the method for manufacturing a thin film transistor provided by at least one embodiment of the present disclosure, the curved line bending pattern is selected from a group consisting of a semicircular ring pattern, a non-closed circular pattern, an S-shaped pattern, and a spiral curved shaped pattern; the straight line bending pattern is selected from a group consisting of a semi-square pattern, a non-closed rectangular pattern, a zigzag pattern, and a helical "rectangular-ambulatory-plane" pattern.

BRIEF DESCRIPTION OF THE DRAWINGS

In order to clarify technical aspects in embodiments of the present disclosure more clearly, drawings of the embodiments are briefly described hereinafter. It will be apparent that the drawings in the following description are merely some embodiments of the present disclosure, and are not intended to limit the present disclosure.

DETAILED DESCRIPTION

In order to make the objectives, technical solutions and advantages of the present disclosure clearer, hereinafter, the technical solutions of the embodiments of the present disclosure will be further described in detail with reference to the accompanying drawings. It is obvious that the described embodiments are part of the present disclosure, and not all embodiments. Based on the described embodiments of the present disclosure, all other embodiments obtained by those skilled in the art without paying creative effort are within the scope of the present disclosure.

Unless otherwise defined, technical terms or scientific terms used in this disclosure should be of ordinary sense to those skilled in the art to which this disclosure pertains. The "first", "second" and similar words used in this disclosure do not denote any order, quantity or importance, but are merely used to distinguish between different constituents. The words "comprising" or "including" and the like mean that the elements or objects preceding the word cover the elements or objects listed later in the word and their equivalents, without excluding other elements or objects. The words "connecting" or "connection" and the like are not limited to physical or mechanical connections, but may include electrical connections, whether direct or indirect. The words "Upper", "lower", "left", "right" and the like are used only to represent the relative positional relationship, and the relative positional relationship may be changed accordingly when the absolute position of the object to be described changes.

Figure 1:
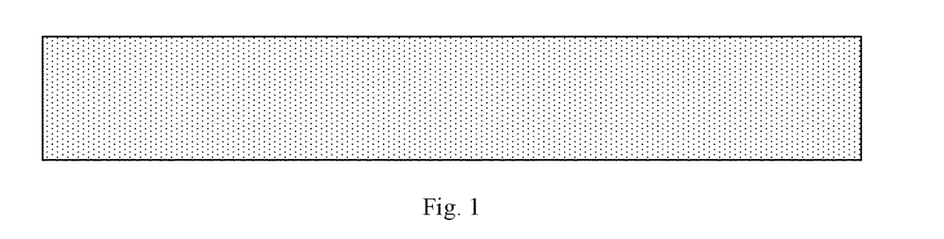
FIG. 1 is a pattern of a channel region.

In general, the pattern of an active layer is a closed straight type (type I) structure. For example, FIG. 1 is a pattern of an active layer, which is a planar straight type structure. For thin film transistors (TFTs) with short channel (that is, the length of the active layer in the channel region is short), the off-state current is large, thus the brightness of the display devices prepared based on this performance is higher and the contrast is poor. In particular, when the active layer of the thin film transistor is made of a carbon nanotube material, since metallic nanotubes are difficult to completely separate from nonmetallic carbon nanotubes, the shorter the channel region of the thin film transistor, the easier the metallic carbon nanotubes interconnect. Thus the off-state current of the display device is increased and the leakage current of the carbon nanotube thin film transistor is increased. The inventors have found that increasing the length of the channel region can effectively reduce the off-state current of the display device.

At least one embodiment of the present disclosure provides a thin film transistor including a substrate and a gate electrode, a gate insulating layer, an active layer, a source electrode and a drain electrode provided on the substrate, the active layer including a source region, a drain region and a channel region between the source region and the drain region, the channel region having a bending pattern.

According to embodiments of the present disclosure, the channel region is provided to have a bending pattern, so that the aspect ratio of the display device can be effectively improved without significantly increasing the area of the thin film transistor region, thereby the off-state current of the display device can be effectively reduced, and high performance display devices can be manufactured. Particularly, when the material of the active layer is one-dimensional semiconductive nanomaterial, the channel region is provided to be a structure with a bending pattern, and the effect of lowering the off-state current of the display device is particularly remarkable.

The technical solution of the present disclosure will be described below with reference to several embodiments.

The First Embodiment

Figure 2:
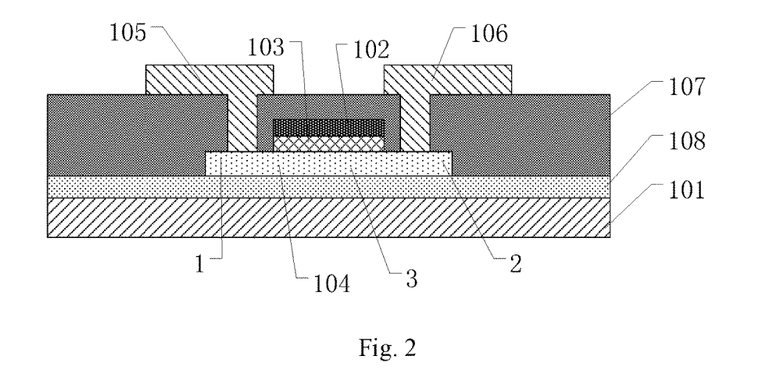
FIG. 2 is a schematic cross-sectional view of a thin film transistor provided in an embodiment of the present disclosure.

The present embodiment provides a thin film transistor. For example, FIG. 2 is a schematic cross-sectional view of a thin film transistor provided in the present embodiment. As shown in FIG. 2, the thin film transistor includes a substrate 101, and a gate electrode 102, a gate insulating layer 103, an active layer 104, a source electrode 105, and a drain electrode 106 provided on the substrate 101. The active layer 104 includes a source region 1, a drain region 2, and a channel region 3 between the source region 1 and the drain region 2. The channel region 3 has a bending pattern.

It should be noted that the channel region having a bending pattern in the present embodiment means that the pattern of the active layer corresponding to the channel region is a pattern which may be a curved line bending structure or a straight line bending structure. By providing a bending pattern, the aspect ratio of the display device can be effectively improved without significantly increasing the area of the thin film transistor region, thereby the off-state current of the display device can be effectively reduced, and high performance display devices can be manufactured. Particularly, when one-dimensional semiconductive nanomaterial is applied to an electronic device, the effect of lowering the off-state current of the display device is particularly remarkable. The performance of electronic devices prepared using one-dimensional semiconductive nanomaterials is superior to that of electronic devices prepared using non-one-dimensional semiconductive nanomaterials. In addition, when the material of the active layer is one-dimensional semiconducting nanomaterials, it is easy to make the channel region have a bending pattern.

Figure 3:
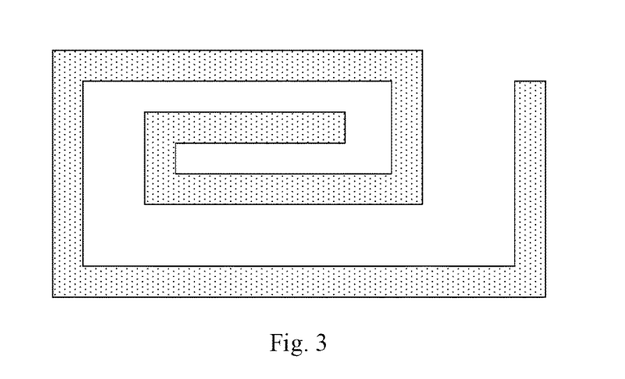
FIG. 3 shows a pattern of a channel region provided in an embodiment of the present disclosure.

For example, in the thin film transistor provided in the present embodiment, the bending pattern is selected from a group consisting of a curved line bending pattern, a straight line bending pattern, and a combination of the curved line bending pattern and the straight line bending pattern. For example, FIG. 3 shows a pattern of a channel region provided in the present embodiment, the pattern of the channel region being a straight line bending pattern, and the straight line bending pattern including a plurality of bent structures. This can increase the length of the straight line bending pattern in order to effectively improve the aspect ratio of the thin film transistor.

Figure 4:
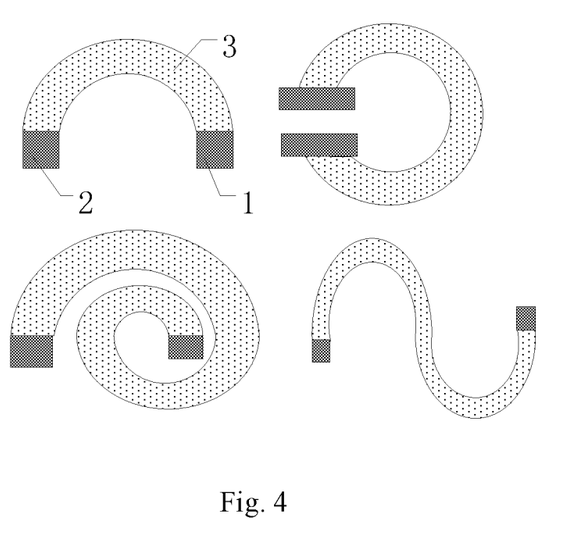
FIG. 4 shows a pattern of a curved line bending channel region provided in an embodiment of the present disclosure.

For example, FIG. 4 shows a pattern of a curved line bending channel region provided in the present embodiment. As shown in FIG. 4, the curved line bending pattern is selected from a group consisting of a semicircular ring pattern, a non-closed circular pattern, an S-shaped pattern, and a spiral curved shaped pattern. The pattern of the channel region is designed as a curved line bending pattern with a plurality of curved structures to further extend the length of the curved line bending pattern to effectively increase the aspect ratio of the thin film transistor. For example, the pattern of the active layer shown in FIG. 4 also includes patterns of the source region 1 and the drain region 2 located at both ends of the channel region 3.

Figure 5:
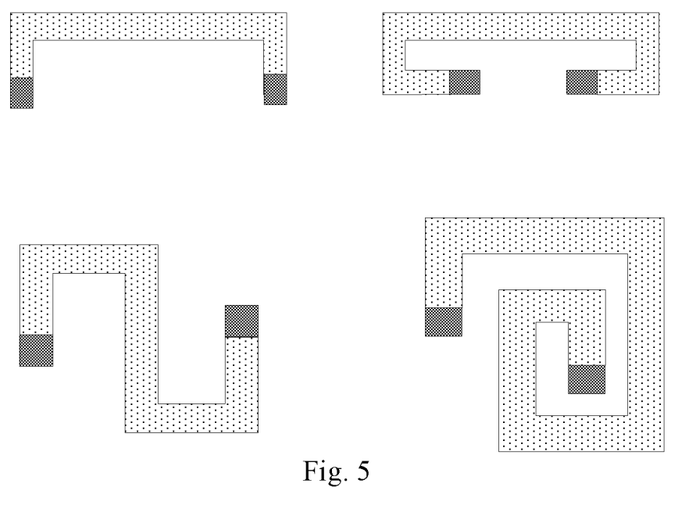
FIG. 5 shows a pattern of a straight line bending channel region provided in an embodiment of the present disclosure.

For example, FIG. 5 shows a pattern of a straight line bending channel region provided in the present embodiment. As shown in FIG. 5, the straight line bending pattern is selected from a group consisting of a semi-square pattern, a non-closed rectangular pattern, a zigzag pattern, and a helical "rectangular-ambulatory-plane" pattern. The pattern of the channel region is designed as a straight line bending pattern with a plurality of bent structures to further extend the length of the curved line bending pattern to effectively increase the aspect ratio of the thin film transistor. For example, the pattern of the active layer shown in FIG. 5 also includes patterns of the source region 1 and the drain region 2 located at both ends of the channel region 3.

For example, in the thin film transistor provided in the present embodiment, the aspect ratio of the active layer in the channel region may be from 0.01 to 0.1. For example, further, the aspect ratio of the active layer in the channel region may be from 0.05 to 0.08. For example, further, the aspect ratio of the active layer in the channel region may be 0.06.

For example, if the exposure accuracy of the lithography apparatus requires a line pitch of 3 μm, as shown in FIG. 5, for a pattern of a straight line bending channel region formed in a carbon nanotube thin film transistor (CNT-TFT) having an aspect ratio of 42 μm/3 μm, and the area of the peripheral gate region is 378 μm² (21 μm×18 μm). For a CNT-TFT having a closed straight channel region, the area of the gate region is 432 μm² (48 μm×9 μm). The CNT-TFT having a straight line bending channel region is reduced by 12.5% (54 μm²). Thus, for the CNT-TFT having a straight line bending channel region, the pixel area is increased and the aperture ratio is increased. If the sub-pixel area is 60 μm×30 μm, the aperture ratio is increased by about 3.0%. If the exposure accuracy of the lithography apparatus is further improved, the required corresponding line pitch is 2 μm, as shown in FIG. 5, for a CNT-TFT having an aspect ratio of 88 μm/2 μm, and the area of the peripheral gate region of the CNT-TFT having a straight line bending channel region is 440 μm² (22 μm×20 μm). For a CNT-TFT having a closed straight channel region, the area of the gate region is 552 μm² (92 μm×6 μm). The CNT-TFT having a straight line bending channel region is reduced by 20.3% (112 μm²). Thus, for the CNT-TFT having a straight line bending channel region, the pixel area is increased and the aperture ratio is increased. If the sub-pixel area is 60 μm×30 μm, the aperture ratio is increased by about 6.2%.

For example, in the thin film transistor provided in the present embodiment, the material of the active layer includes a one-dimensional semiconductive nanomaterial, and the material of the active layer may further include a metal oxide semiconductor or an amorphous silicon semiconductor material.

For example, in the thin film transistor provided in the present embodiment, the one-dimensional semiconductive nanomaterials include semiconductive carbon nanotubes and semiconductive silicon nanowires. For example, the one-dimensional semiconductive nanomaterials may also include nanowires made from IIIB-V materials such as scandium (Sc), titanium (Ti), cobalt (Co) and the like.

For example, among one-dimensional semiconducting nanomaterials, semiconductive carbon nanotubes have the excellent properties required to build efficient nano-opto-electronic devices. Semiconductive carbon nanotubes can make up for deficiencies of optoelectronic materials such as poor stability, larger size and the like. For example, the semiconductive carbon nanotube may be a semiconductive single-walled carbon nanotube, a semiconductive double-walled carbon nanotube, or a semiconductive multi-walled carbon nanotube. Semiconductive carbon nanotubes are a direct bandgap material with good light absorption properties. Semiconductive carbon nanotubes have very high room temperature mobility and are good conductive channel materials. In addition, the carbon nanotube film has a very low light reflection coefficient, and its spectral absorption range covers ultraviolet light, visible light to infrared light band.

A variety of nano-electronic devices based on the semiconductive carbon nanotubes, especially field-effect transistors, show the characteristics that are superior to thin film transistors prepared by other non-one-dimensional semiconductor materials in terms of main performance indexes such as power consumption and integration degree. In addition, since the polarity of the field effect transistor based on semiconductive carbon nanotubes depends on the metal materials for forming the source electrode and the drain electrode. For example, the source electrode and the drain electrode formed by the metal materials can have an ohmic contact with electrons and holes formed by the semiconductive carbon nanotubes, to form a high-performance hole-type (p-type) field-effect transistor, and can enhance the performance of the transistor.

The overlap of multiple semiconductive carbon nanotubes has a serious effect on the off-state current of semiconducting carbon nanotubes, and by increasing the length of the channel, the adverse effects of overlapping semiconductive carbon nanotubes on the off-state current of the device can be reduced. Increasing the channel length in the limited area range, that is, using the design of a bending pattern of the active layer, can improve the aspect ratio of the device, so as to make the switching characteristics of the TFT better while ensuring a large aperture ratio and high resolution.

For example, the thickness of the source electrode and the drain electrode formed at both ends of the channel region may be 50 nm to 80 nm. The side walls of the surfaces of the source electrode and the drain electrode which face each other are steeper for example, the source electrode and the drain electrode are perpendicular to the channel region formed by one-dimensional semiconductive nanomaterials.

For example, in the thin film transistor provided in the embodiments of the present embodiment, the thin film transistor may be a bottom gate type structure, a top gate type structure or a double gate type structure. The top gate and the bottom gate are positioned relative to the positions of the active layer and the gate electrode, i.e., with respect to the substrate, when the gate electrode is close to the substrate and the active layer is away from the substrate, the transistor is a bottom gate type thin film transistor; when the gate electrode is away from the substrate, and the active layer is close to the substrate, the transistor is a top gate type thin film transistor. The double gate type structure includes the top gate and the bottom gate. For example, the thin film transistor shown in FIG. 2 is a top gate type structure, and FIG. 6 is a schematic cross-sectional view of another thin film transistor provided in the present embodiment, which is a bottom gate type structure.

For example, as shown in FIG. 2, the top gate type oxide thin film transistor includes a substrate 101, and an active layer 104, a gate insulating layer 103, a gate metal layer 102, an insulating layer 107, a drain electrode 105, and a source electrode 106 provided in succession on the substrate 101. The top gate type oxide thin film transistor may further include a buffer layer 108 disposed between the substrate 101 and the active layer 104. For example, the buffer layer 108 acts as a transition film between the active layer 104 and the substrate 101, which makes the active layer 104 and the substrate 101 more securely bonded and can prevent harmful impurities, ions, etc. in the substrate 101 from diffusing into the active layer 104.

For example, the material of the buffer layer 108 includes silicon oxide ($SiO_x$) or silicon nitride ($SiN_x$). For example, the buffer layer 108 may be a single layer structure composed of silicon nitride or silicon oxide, or a two-layer structure composed of silicon nitride and silicon oxide.

Figure 6:
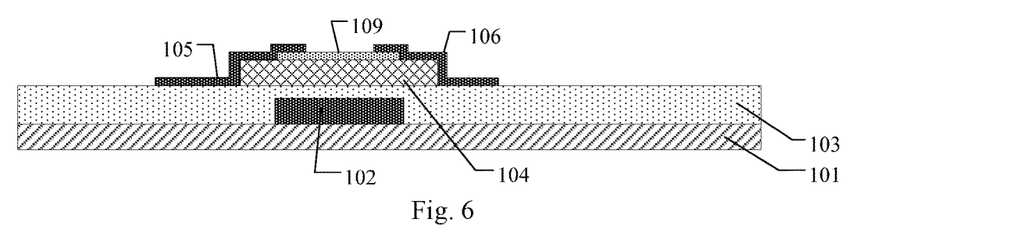
FIG. 6 is a schematic cross-sectional view of another thin film transistor in an embodiment of the present disclosure.

For example, as shown in FIG. 6, the bottom gate type thin film transistor includes a substrate 101, and a gate electrode 102, a gate insulating layer 103, an active layer 104, a drain electrode 105 and a source electrode 106 provided in succession on the substrate 101. As necessary, the bottom gate type thin film transistor may also include an etch stop layer 109 disposed between the active layer 104 and the source electrode 106, between the active layer 104 and the drain electrode 105, the material of the etch stop layer 109 including silicon nitride ($SiN_x$) and so on.

For example, the material of the active layer 104 is semiconductive carbon nanotubes and semiconductive silicon nanowires. The thickness of the active layer 104 may be 30 nm to 50 nm, for example, 30 nm, 40 nm, or 50 nm.

For example, the materials of the gate electrode 102, the source electrode 105, and the drain electrode 106 include metal materials such as molybdenum, titanium, copper and chromium, or an alloy material formed of the above metals. For example, copper-based alloy materials include copper molybdenum alloy (CuMo), copper titanium alloy (CuTi), copper molybdenum titanium alloy (CuMoTi), copper molybdenum tungsten alloy (CuMoW), copper molybdenum niobium alloy (CuMoNb), etc. Chrome-based alloy materials include chromium molybdenum alloy (CrMo), chromium titanium alloy (CrTi), chromium molybdenum titanium alloy (CrMoTi), etc. For example, the thicknesses of the gate electrode 102, the source electrode 105, and the drain electrode 106 may be 1 nm to 500 nm respectively. In one embodiment, the thickness of the gate electrode 102 may be 200 nm to 300 nm. In one embodiment, the thickness of the gate electrode 102 may be 250 nm.

For example, the materials used as the gate insulating layer 103 include silicon nitride ($SiN_x$), silicon oxide ($SiO_x$), aluminum oxide ($Al_2O_3$), aluminum nitride (AlN), or other suitable materials. For example, the thickness of the gate insulating layer 103 may be 1 nm to 100 nm. In one embodiment, the thickness of the gate insulating layer 103 may be 50 nm.

For example, the material of the substrate 101 includes transparent glass, ceramic, or metal.

The Second Embodiment

The present embodiment provides an array substrate comprising any one of the thin film transistors of the first embodiment and a first electrode electrically connected to the source electrode or the drain electrode of the thin film transistor. For example, the array substrate may be applied to, for example, a liquid crystal display panel, an organic light emitting diode display panel, an electronic paper display panel, and the like. The structure of each layer of the thin film transistor can refer to the relevant description of the first embodiment, and will not be described again.

Figure 7:
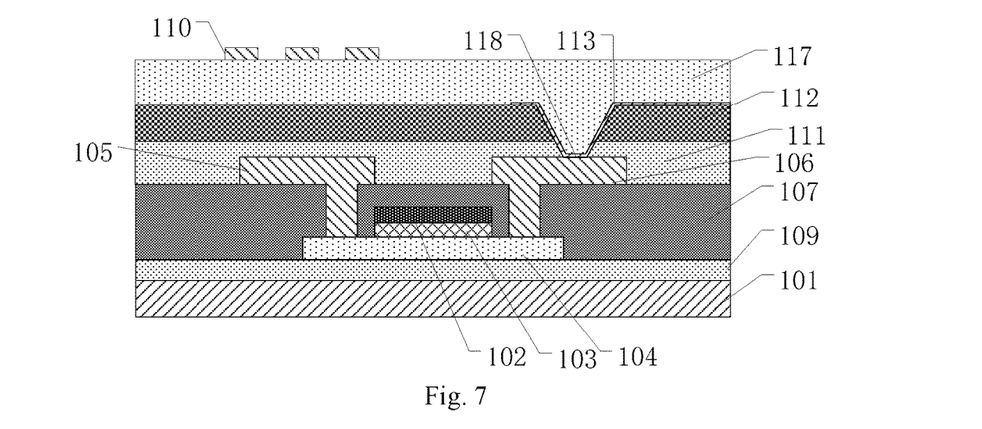
FIG. 7 is a schematic cross-sectional view of an array substrate provided in an embodiment of the present disclosure.

For example, schematically, the first electrode 113 is a pixel electrode.

For example, FIG. 7 is a schematic cross-sectional view of an array substrate provided in the present embodiment. As shown in FIG. 7, the array substrate further includes a second insulating layer 112, a passivation layer 111, and a common electrode 110. The pixel electrode 113 (the first electrode) is electrically connected to, for example, the drain electrode 106 of the thin film transistor, through a first via structure 118 formed in the second insulating layer 112 and the passivation layer 111. The source electrode 105 of the thin film transistor is electrically connected or integrally formed with a data line (not shown). The gate electrode 102 of the thin film transistor is electrically connected or integrally formed with a gate line (not shown). Typically, the data lines and the gate lines crossing each other define the sub-pixels on the array substrate, and the thin film transistor acts as the switching element of the sub-pixel.

For example, the pixel electrode 113 is formed of a transparent conductive material or a metal material. For example, the material forming the pixel electrode 113 includes indium tin oxide (ITO), indium zinc oxide (IZO), indium gallium oxide (IGO), gallium zinc oxide (GZO), zinc oxide (ZnO), indium oxide ($In_2O_3$), aluminum zinc oxide (AZO) and carbon nanotubes, etc.

For example, the material of the passivation layer 111 may be silicon nitride ($SiN_x$), silicon oxide ($SiO_x$), and acrylic resin, etc.

For example, the material of the second insulating layer 112 may be an organic insulating material or an inorganic insulating material or a laminated structure formed of an organic insulating material and an inorganic insulating material. For example, the material forming the insulating layer is silicon nitride ($SiN_x$), silicon oxide ($SiO_x$), acrylic resin, and the like.

For example, for an In-Plane Switch (referred to as IPS) array substrate, the pixel electrode 113 and the common electrode 110 are alternatively arranged at the same layer and are both strip electrodes. For the Advanced-super-Dimensional Switching (referred to as ADS) array substrate, the pixel electrode 113 and the common electrode 110 are arranged at different layers, the electrode at the upper layer is a stripe-shaped electrode, and the electrode at the lower layer is a plate-like electrode.

For example, a third insulating layer 117 is provided between the pixel electrode 113 and the common electrode 110 when the pixel electrode 113 and the common electrode 110 are arranged at different layers.

For example, schematically, the first electrode may be an anode of an organic light emitting diode, and the array substrate also includes an organic material functional layer and a cathode located above the anode (the first electrode).

Figure 8:
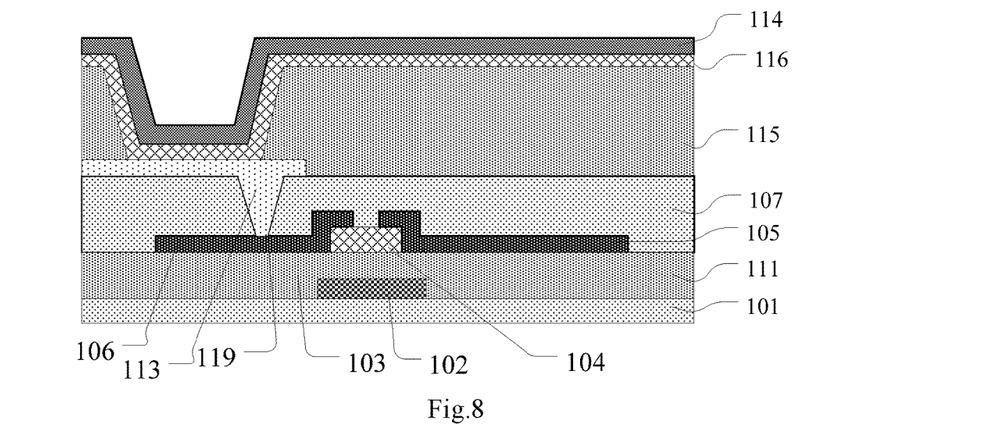
FIG. 8 is a schematic cross-sectional view of another array substrate provided in an embodiment of the present disclosure.

For example, FIG. 8 is a schematic cross-sectional view of another array substrate provided in the present embodiment. As shown in FIG. 8, the array substrate includes any one of the thin film transistors in the first embodiment and the first electrode 113. The first electrode 113 is an anode, which is electrically connected to the drain electrode 106 through a second via structure 119 provided in the insulating layer 107. The array substrate also includes a pixel defining layer 115, an organic material functional layer 116, and a cathode 114 located above the anode 113.

The pixel defining layer 115 may be used to separate two adjacent sub-pixel units from each other.

For example, the organic material functional layer may include a hole transport layer, a light emitting layer, and an electron transport layer. In order to improve the efficiency of injecting electrons and holes into the light emitting layer, in one embodiment, the organic material functional layer may also include an electron injection layer disposed between the cathode and the electron transport layer and a hole injection layer disposed between the anode and the hole transport layer. In one embodiment, due to the particularity of the organic material functional layer, the organic electroluminescent diode display also includes an encapsulation layer.

Based on this, according to the different materials of the anode and the cathode, the substrate can be classified as a single-sided optical array substrate and a double-sided optical array substrate. That is, when the material of one electrode of the anode and cathode is opaque or translucent, the array substrate is a single-sided light-emitting type array substrate, and when both the material of the anode and the material of the cathode are transparent materials and/or translucent materials, the array substrate is a double-sided light-emitting type array substrate.

For a single-sided light-emitting type array substrate, according to the different materials of the anode and the cathode, the substrate can be classified as a top-emitting type array substrate and a bottom-emitting type array substrate. When the anode is disposed close to the substrate and the cathode is disposed away from the substrate and the material of the anode is a transparent conductive material and the material of the cathode is an opaque conductive material, the light is emitted from the anode and trough one side of the substrate, it is referred to as a bottom-emitting type array substrate. When the anode material is an opaque conductive material and the cathode material is a transparent or translucent conductive material, since the light is emitted from the cathode away from the substrate side, it is referred to as a top-emitting type array substrate. It is also possible to replace the relative positions of the two kinds of anodes and cathodes as described above.

For a double-sided light-emitting type flexible display substrate, when the anode is placed close to the substrate, the cathode is disposed away from the substrate, and both the material of the anode and the material of the cathode are transparent conductive materials or translucent materials, as the light can be emitted from the anode and trough one side of the substrate, or, the light can be emitted from the cathode away from the substrate side, it is referred to as a double-sided light-emitting type flexible display substrate. Herein, the anode may be disposed away from the substrate, and the cathode may be disposed close to the substrate.

The Third Embodiment

The present embodiment provides a display device including any one of the array substrates of the second embodiment. The display device may be any product or component having a display function such as a liquid crystal panel, an electronic paper, an OLED panel, a mobile phone, a tablet computer, a television set, a monitor, a notebook computer, a digital photo frame, a navigator, and the like.

The Fourth Embodiment

The present embodiment provides a method for manufacturing a thin film transistor, which includes forming a gate electrode, a gate insulating layer, an active layer, a source electrode and a drain electrode on a substrate, wherein the active layer includes a source region, a drain region and a channel region between the source region and the drain region, and the channel region has a bending pattern.

For example, the bending pattern is selected from a group consisting of a curved line bending pattern, a straight line bending pattern, and a combination of a curved line bending pattern and a straight line bending pattern. For example, the bending pattern includes a plurality of bent structures or curved structures, or combination of the bent structures and the curved structures.

For example, the curved line bending pattern is selected from a group consisting of a semicircular ring pattern, a non-closed circular pattern, an S-shaped pattern, and a spiral curved shaped pattern.

For example, the straight line bending pattern is selected from a group consisting of a semi-square pattern, a non-closed rectangular pattern, a zigzag pattern, and a helical "rectangular-ambulatory-plane" pattern.

For example, a bottom gate type thin film transistor is described as an example. The method for manufacturing a thin film transistor includes the following steps.

A substrate is provided and then cleaned by a standard cleaning method. For example, the material of the substrate includes transparent glass, ceramic or metal.

The silicon oxide ($SiO_x$) or silicon nitride ($SiN_x$) is deposited by chemical vapor deposition to form a buffer layer having a thickness of 200 nm.

A gate metal thin film is deposited on the buffer layer by means of magnetron sputtering, and photoresist is coated on the gate metal thin film. And then the gate metal thin film is subject to processes such as exposure, development and etching to form a gate pattern. Materials for forming a gate electrode include metal materials such as molybdenum, titanium, copper and chromium, or alloy materials formed from the above metals. For example, copper-based alloy materials include copper molybdenum alloy (CuMo), copper titanium alloy (CuTi), copper molybdenum titanium alloy (CuMoTi), copper molybdenum tungsten alloy (CuMoW), copper molybdenum niobium alloy (CuMoNb), etc. Chrome-based alloy materials include chromium molybdenum alloy (CrMo), chromium titanium alloy (CrTi), chromium molybdenum titanium alloy (CrMoTi), etc. For example, the thickness of the gate electrode may be 1 nm to 500 nm. In one embodiment, the thickness of the gate electrode may be 200 nm to 300 nm. In one embodiment, the thickness of the gate electrode may be 250 nm.

A gate insulating layer film is deposited on the gate metal layer by chemical vapor deposition at a temperature of 200° C. to 400° C., for example, 370° C. The materials used as the gate insulating layer include silicon nitride ($SiN_x$), silicon oxide ($SiO_x$), aluminum oxide ($Al_2O_3$), aluminum nitride (AlN), or other suitable materials. For example, the thickness of the gate insulating layer may be 1 nm to 100 nm. In one embodiment, the thickness of the gate insulating layer may be 50 nm.

For example, a semiconductive thin film is coated on the gate insulating layer by means of spin coating. For example, the semiconductive thin film is a one-dimensional semiconductive nanomaterial. For example, the one-dimensional semiconductive nanomaterial is a semiconductive carbon nanotube. And then the semiconductive carbon nanotubes are exposed with a mask plate having a bending pattern, and then the semiconductive thin film is subjected to dry etching with oxygen and the photoresist is peeled off to obtain a bending pattern of an active layer formed of semiconductive carbon nanotube.

For example, a source electrode metal film and a drain electrode metal film are deposited on the pattern of the active layer formed of semiconductive carbon nanotube by means of magnetron sputtering, and photoresist is coated on the source electrode metal film and the drain electrode metal film. And then the source electrode metal film and the drain electrode metal film are subject to processes such as exposure, development and etching to form a gate pattern and a drain pattern. Materials for forming the source electrode and the drain electrode include metal materials such as molybdenum, titanium, copper and chromium, or alloy materials formed from the above metals. For example, copper-based alloy materials include copper molybdenum alloy (CuMo), copper titanium alloy (CuTi), copper molybdenum titanium alloy (CuMoTi), copper molybdenum tungsten alloy (CuMoW), copper molybdenum niobium alloy (CuMoNb), etc. Chrome-based alloy materials include chromium molybdenum alloy (CrMo), chromium titanium alloy (CrTi), chromium molybdenum titanium alloy (CrMoTi), etc. For example, the thicknesses of the source electrode or the drain electrode may be 1 nm to 500 nm. In one embodiment, the thickness of the source electrode or the drain electrode may be 200 nm to 300 nm. In one embodiment, the thickness of the source electrode or the drain electrode may be 250 nm.

When the thin film transistor is a top gate type structure, its manufacturing method is similar to that of the bottom gate type thin film transistor, except that the active layer is first formed on the substrate, and then the gate insulating layer and the gate electrode are formed. The process of preparing each layer structure can be found in the description of the above-mentioned process of forming the bottom gate type thin film transistor, and it will not be described here.

Embodiment of the present disclosure provides a thin film transistor and manufacturing method thereof, an array substrate, and a display device. The thin film transistor includes a substrate and a gate electrode, a gate insulating layer, an active layer, a source electrode and a drain electrode provided on the substrate, the active layer including a source region, a drain region and a channel region between the source region and the drain region, the channel region having a bending pattern.

According to embodiments of the present disclosure, the channel region is provided to have a bending pattern, so that the aspect ratio of the display device can be effectively improved without significantly increasing the area of the thin film transistor region, thereby the off-state current of the display device can be effectively reduced, and high performance display devices can be manufactured. When the material of the active layer is one-dimensional semiconductive nanomaterial, the channel region is provided to be a structure with a bending pattern, and the effect of lowering the off-state current of the display device is particularly remarkable.

The following points need to be explained.

(1) The accompanying drawings of the present disclosure relate only to the structure to which the present disclosure relates, and other structures may be referred to the conventional design.

(2) For clarity, the thickness of the layer or region is enlarged or reduced in the drawings for describing the embodiments of the present disclosure, that is, the drawings are not drawn to the actual proportions. It will be appreciated that when an element, such as a layer, a film, a region, or a substrate, is referred to as being "on" or "below" another element, the element may be "directly" "on" or "below" the other element, or there may be an intermediate element.

(3) In the event of non-conflict, embodiments of the present disclosure and the features of the embodiments may be combined with each other to obtain a new embodiment.

The above described are only the specific embodiments of the present disclosure, but the protection scope of the present disclosure is not limited thereto, and the protection scope of the present disclosure should be based on the protection scope of the claims.

What is claimed is:

1. A thin film transistor, comprising:
   a substrate;
   a gate electrode, a gate insulating layer, an active layer, a source electrode, and a drain electrode provided on the substrate;
   wherein the active layer comprises a source region, a drain region, and a channel region between the source region and the drain region, and the channel region has a bending pattern;
   the bending pattern is selected from a group consisting of a curved line bending pattern, a straight line bending pattern, and a combination of the curved line bending pattern and the straight line bending pattern; and
   the curved line bending pattern is selected from a group consisting of a semicircular ring pattern, a non-closed circular pattern, an S-shaped pattern, and a spiral curved shaped pattern; and
   materials of the active layer comprise one-dimensional semiconductive nanomaterials.

2. The thin film transistor of claim 1, wherein the straight line bending pattern is selected from a group consisting of a semi-square pattern, a non-closed rectangular pattern, a zigzag pattern, and a helical "rectangular-ambulatory-plane" pattern.

3. The thin film transistor of claim 1, wherein the one-dimensional semiconductive nanomaterials comprise semiconductive carbon nanotubes or semiconductive silicon nanowires.

4. The thin film transistor of claim 3, wherein the thin film transistor has a top gate type structure or a bottom gate type structure.

5. An array substrate, comprising the thin film transistor of claim 1 and a first electrode electrically connected to the source electrode or the drain electrode of the thin film transistor.

6. The array substrate of claim 5, wherein the bending pattern is selected from a group consisting of a curved line bending pattern, a straight line bending pattern, and a combination of the curved line bending pattern and the straight line bending pattern.

7. The array substrate of claim 6, wherein the curved line bending pattern is selected from a group consisting of a semicircular ring pattern, a non-closed circular pattern, an S-shaped pattern, and a spiral curved shaped pattern.

8. The array substrate of claim 5, wherein the first electrode is a pixel electrode, and the array substrate further comprises a common electrode, and the common electrode and the pixel electrode form an electric field.

9. The array substrate of claim 5, wherein the first electrode is an anode, and the array substrate further comprises an organic material functional layer and a cathode located above the anode.

10. A display device, comprising the array substrate of claim 5.

11. A method for manufacturing a thin film transistor, comprising providing a substrate, forming a gate electrode, a gate insulating layer, an active layer, a source electrode, and a drain electrode on the substrate; wherein the active layer comprises a source region, a drain region, and a channel region between the source region and the drain region, the channel region having a bending pattern selected from a group consisting of a curved line bending pattern, a straight line bending pattern, and a combination of the curved line bending pattern and the straight line bending pattern and wherein the curved line bending pattern is selected from a group consisting of a semicircular ring pattern, a non-closed circular pattern, an S-shaped pattern, and a spiral curved shaped pattern; the straight line bending pattern is selected from a group consisting of a semi-square pattern, a non-closed rectangular pattern, a zigzag pattern, and a helical "rectangular-ambulatory-plane" pattern, and     materials of the active layer comprise one-dimensional semiconductive nanomaterials.

* * * * *